United States Patent
Fujitsuka et al.

(10) Patent No.: US 7,972,927 B2
(45) Date of Patent: Jul. 5, 2011

(54) METHOD OF MANUFACTURING A NONVOLATILE SEMICONDUCTOR MEMORY DEVICE

(75) Inventors: Ryota Fujitsuka, Yokohama (JP); Katsuyuki Sekine, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/540,663

(22) Filed: Aug. 13, 2009

(65) Prior Publication Data

US 2010/0041206 A1    Feb. 18, 2010

(30) Foreign Application Priority Data

Aug. 14, 2008   (JP) ................. 2008-208945

(51) Int. Cl.
   *H01L 21/336*   (2006.01)
   *H01L 21/3205*  (2006.01)
   *H01L 21/4763*  (2006.01)

(52) U.S. Cl. ............... 438/264; 257/E21.159; 438/591

(58) Field of Classification Search .............. 438/591, 438/424, 264, 261; 257/E21.159, E21.209, 257/E21.21

See application file for complete search history.

(56) References Cited

U.S. PATENT DOCUMENTS

| | | | |
|---|---|---|---|
| 6,537,881 B1 * | 3/2003 | Rangarajan et al. | 438/261 |
| 7,619,274 B2 * | 11/2009 | Mitani et al. | 257/315 |
| 2008/0014745 A1 | 1/2008 | Fujitsuka et al. | |
| 2009/0181530 A1 * | 7/2009 | Lisiansky et al. | 438/591 |

FOREIGN PATENT DOCUMENTS

JP   2007-282859   11/2007

OTHER PUBLICATIONS

Ozawa, "Semiconductor Device and Method of Manufacturing the Same", U.S. Appl. No. 12/425,077, filed Apr. 16, 2009.

* cited by examiner

*Primary Examiner* — Walter L Lindsay, Jr.
(74) *Attorney, Agent, or Firm* — Finnegan, Henderson, Farabow, Garrett & Dunner, L.L.P.

(57) ABSTRACT

According to a method of manufacturing a MONOS nonvolatile semiconductor memory device, a tunnel insulating film, a charge storage layer, a block insulating film containing a metal oxide and a control gate electrode are stacked on a semiconductor substrate. Heat treatment is carried out in an atmosphere containing an oxidizing gas after the tunnel insulating film, the charge storage layer and the block insulating film are stacked on the semiconductor substrate. Thereafter, the control gate electrode is formed on the block insulating film.

16 Claims, 8 Drawing Sheets

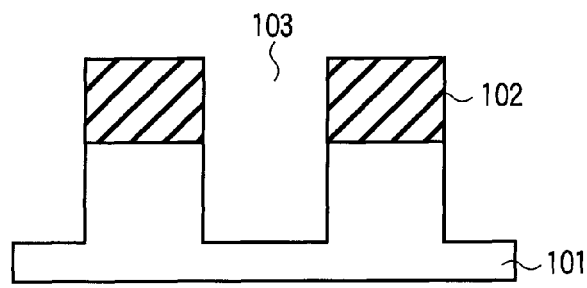
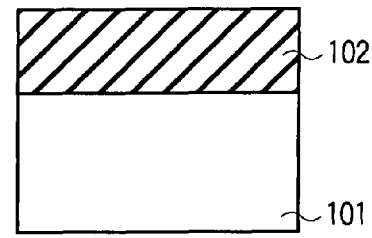
FIG. 3A          FIG. 3B
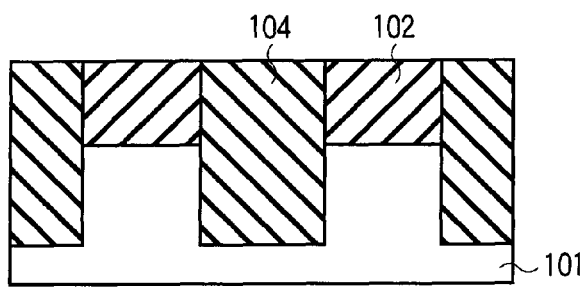
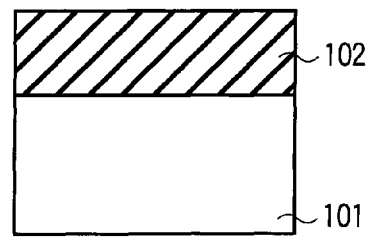
FIG. 4A          FIG. 4B
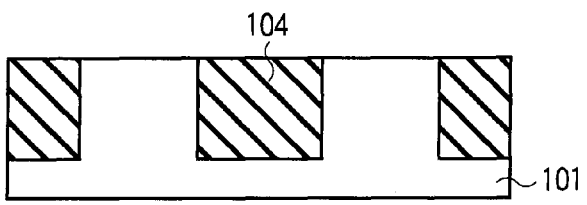
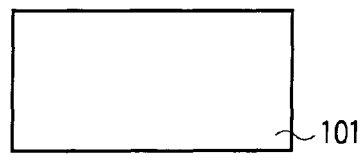
FIG. 5A          FIG. 5B

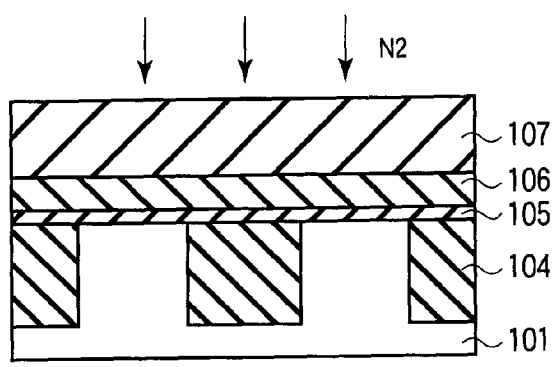 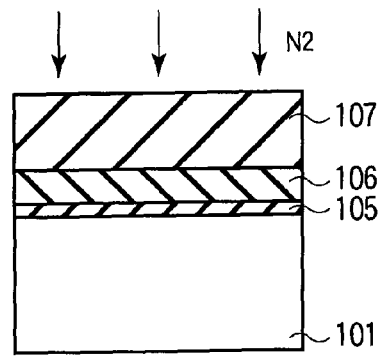
FIG. 6A  FIG. 6B
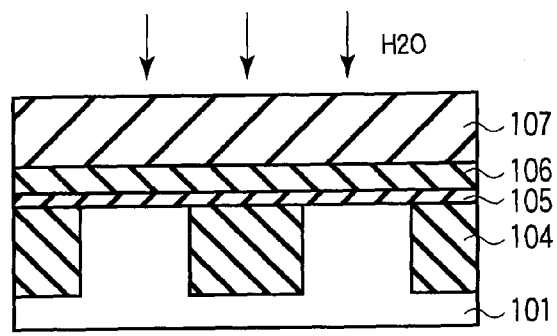 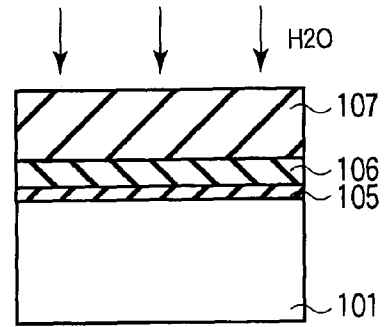
FIG. 7A  FIG. 7B
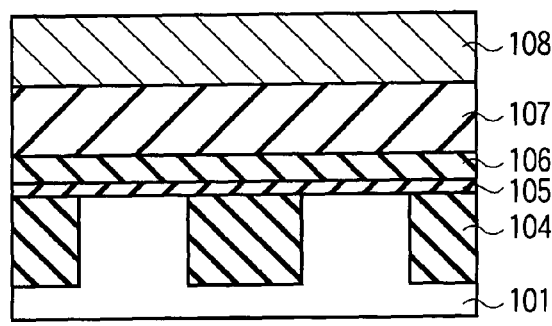 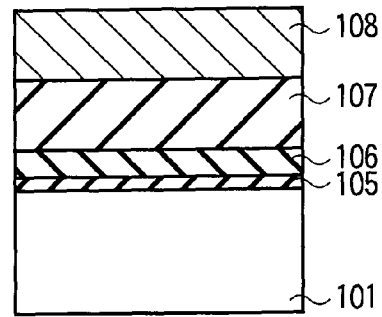
FIG. 8A  FIG. 8B

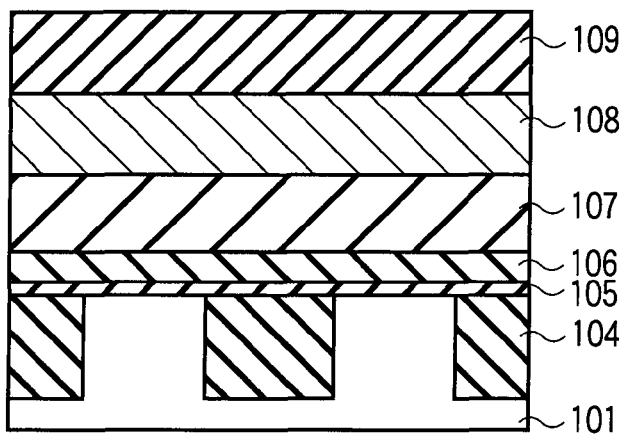
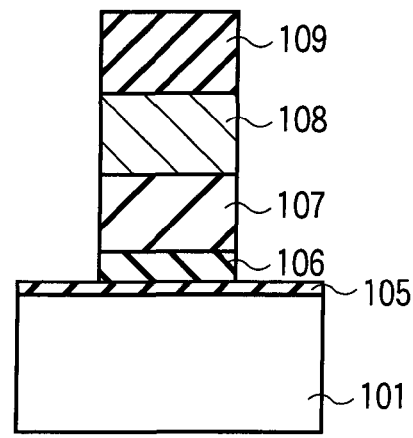
FIG. 9A          FIG. 9B
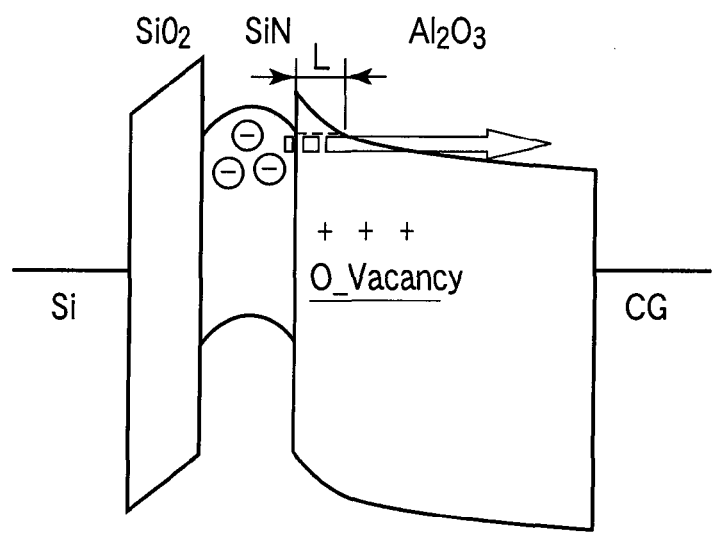
FIG. 10

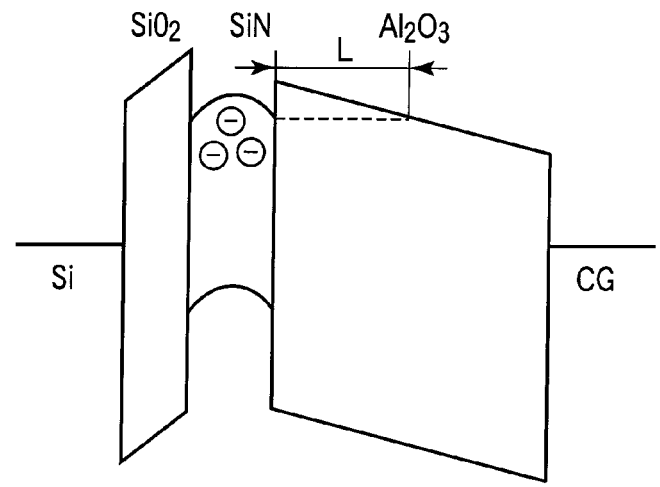
F I G. 11
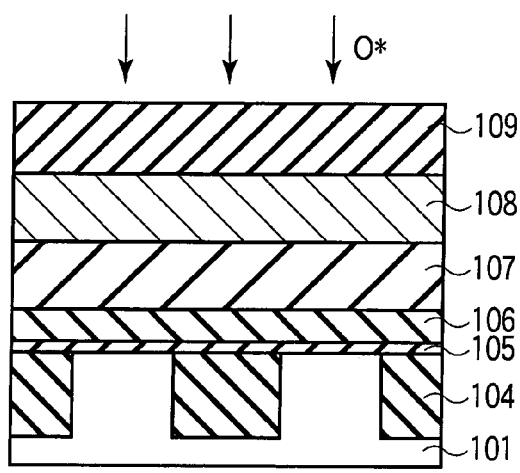
F I G. 12A
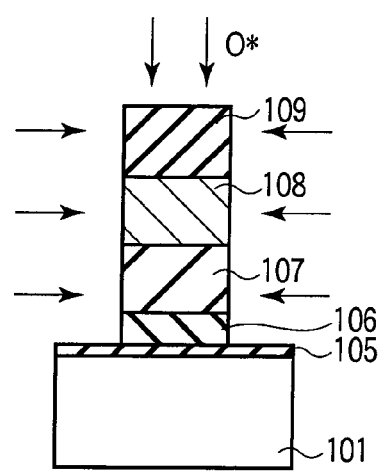
F I G. 12B

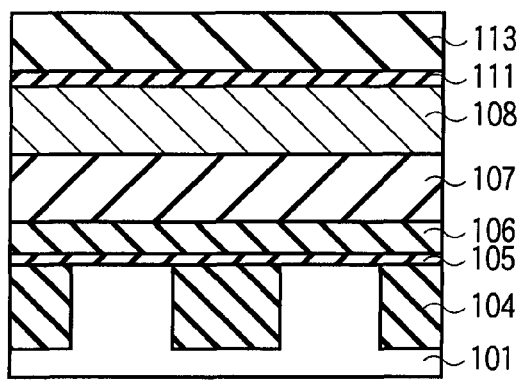 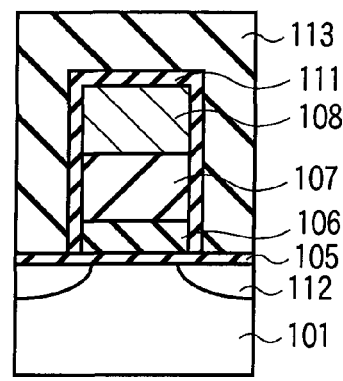
F I G. 13A  F I G. 13B
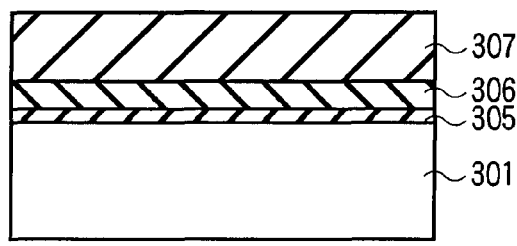 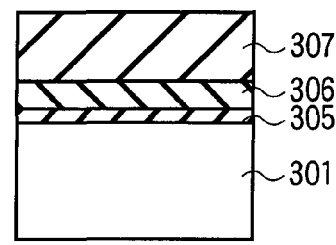
F I G. 14A  F I G. 14B
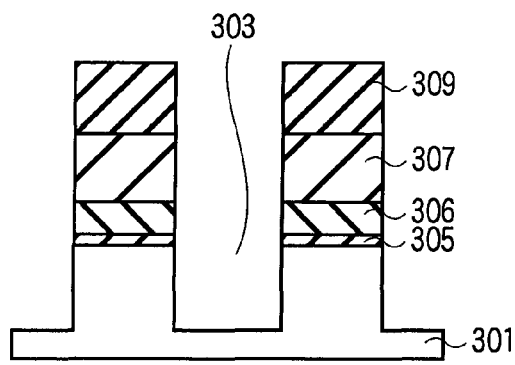 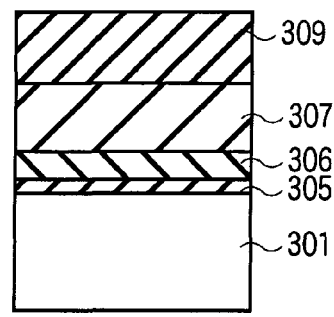
F I G. 15A  F I G. 15B

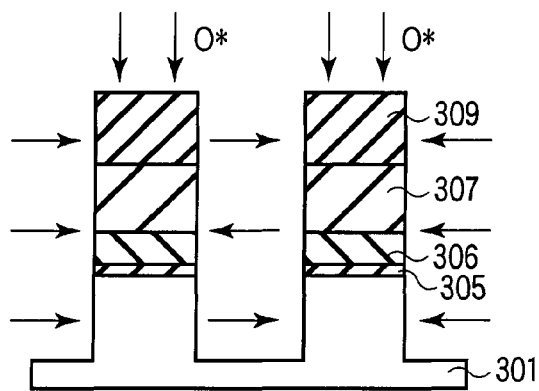
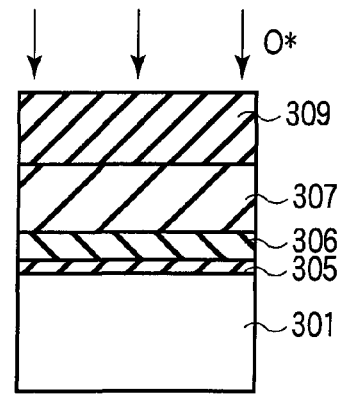
F I G. 16A    F I G. 16B
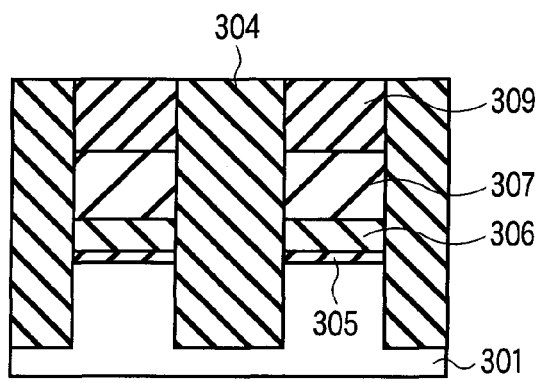
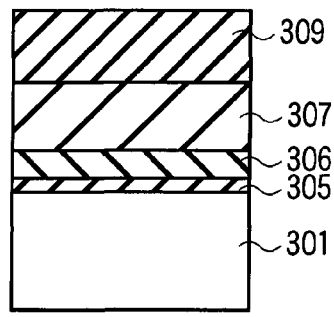
F I G. 17A    F I G. 17B

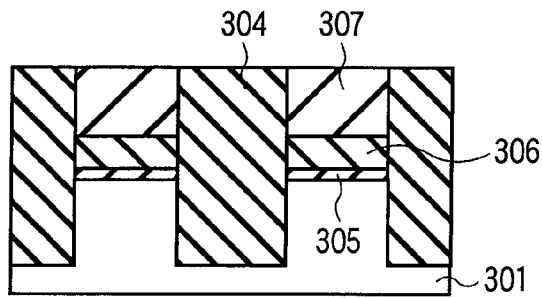 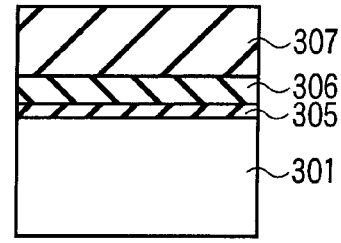
F I G. 18A              F I G. 18B
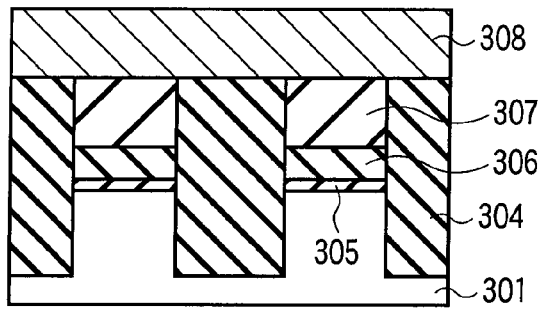 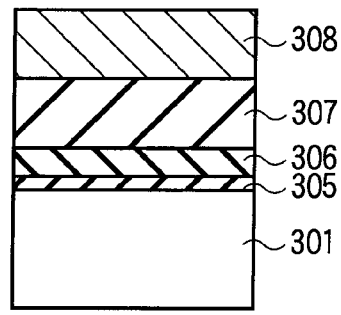
F I G. 19A              F I G. 19B
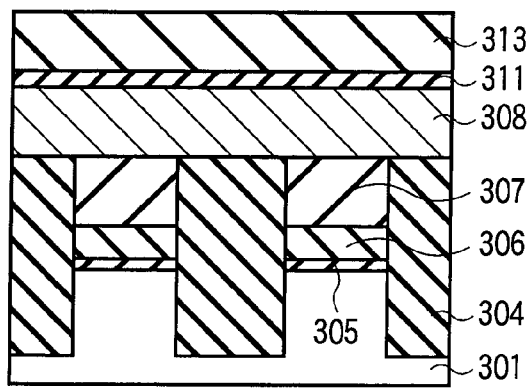 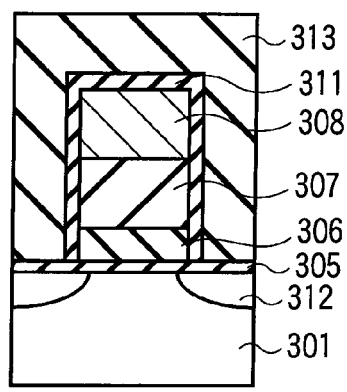
F I G. 20A              F I G. 20B

US 7,972,927 B2

METHOD OF MANUFACTURING A NONVOLATILE SEMICONDUCTOR MEMORY DEVICE

CROSS-REFERENCE TO RELATED APPLICATIONS

This application is based upon and claims the benefit of priority from prior Japanese Patent Application No. 2008-208945, filed Aug. 14, 2008, the entire contents of which are incorporated herein by reference.

BACKGROUND OF THE INVENTION

1. Field of the Invention

The present invention relates to a method of manufacturing a MONOS nonvolatile semiconductor memory device. In particular, the present invention relates to a method of manufacturing a nonvolatile semiconductor memory device using a metal oxide as a block insulating film.

2. Description of the Related Art

Recently, a MONOS memory using an insulating film such as a silicon nitride film as a charge storage layer has been developed for one of the future nonvolatile semiconductor memory device. In general, the MONOS memory is configured to a structure that a charge storage layer is formed through a tunnel insulating film on a semiconductor substrate, and a block insulating film is formed on the charge storage layer, and further, a control gate electrode is formed on the block insulating film. A write/erase operation of a memory cell is carried out by applying high electric field to the tunnel insulating film. In this case, the block insulating film requires high insulation properties in order to prevent carrier which is trapped in the charge storage layer from leaking through the block insulating film during the data retention or Program/Erase operation.

In contrast, a high-dielectric constant insulating film containing a metal oxide (High-k film: The dielectric constant is typically 7 or more, which is higher than the value of silicon nitride) is effective to reduce a leakage current. Because the physical film thickness can be gotten thick without increasing EOT (Equivalent Oxide Thickness). Therefore, the high-dielectric constant insulating film is effective as the block insulating film of the MONOS memory. For example, a MANOS structure using an $Al_2O_3$ film (dielectric constant: 10) as the block insulating film is given (e.g., see Jpn. Pat. Appln. KOKAI Publication No. 2007-282859).

However, in fact, if the High-k film was applied for the block insulating film of the MONOS memory, it never realizes the sufficient dielectric characteristics corresponding to its physical property. For this reason, there is a problem that desired data retention and write/erase characteristics are not obtained.

BRIEF SUMMARY OF THE INVENTION

According to a first aspect of the invention, there is provided a method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

carrying out a first heat treatment in an atmosphere containing an oxidizing gas after the block insulating film is formed;

forming a control gate electrode on the block insulating film after the first heat treatment is carried out; and processing the control gate electrode, the block insulating film and the charge storage layer to a gate pattern.

According to a second aspect of the invention, there is provided a method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

forming a control gate electrode on the block insulating film;

processing the control gate electrode, the block insulating film and the charge storage layer to a gate pattern; and carrying out a first heat treatment in an atmosphere containing an oxidizing gas after the gate pattern is formed.

According to a third aspect of the invention, there is provided a method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

forming an isolation trench extending from the block insulating film to the semiconductor substrate to isolate the charge storage layer in a channel width direction;

carrying out a first heat treatment in an atmosphere containing an oxidizing gas after the isolation trench is formed; and filling an isolation insulating film in the isolation trench after the first heat treatment is carried out.

BRIEF DESCRIPTION OF THE SEVERAL VIEWS OF THE DRAWING

FIGS. 3A and 3B are cross-sectional views showing the process of manufacturing a MONOS nonvolatile semiconductor memory device according to a first embodiment;

FIGS. 4A and 4B are cross-sectional views showing the process of manufacturing a MONOS nonvolatile semiconductor memory device according to a first embodiment;

FIGS. 5A and 5B are cross-sectional views showing the process of manufacturing a MONOS nonvolatile semiconductor memory device according to a first embodiment;

FIGS. 6A and 6B are cross-sectional views showing the process of manufacturing a MONOS nonvolatile semiconductor memory device according to a first embodiment;

FIGS. 7A and 7B are cross-sectional views showing the process of manufacturing a MONOS nonvolatile semiconductor memory device according to a first embodiment;

FIGS. 8A and 8B are cross-sectional views showing the process of manufacturing a MONOS nonvolatile semiconductor memory device according to a first embodiment;

FIGS. 9A and 9B are cross-sectional views showing the process of manufacturing a MONOS nonvolatile semiconductor memory device according to a first embodiment;

FIG. 10 is an energy band diagram during data retention for the conventional structure;

FIG. 11 is an energy band diagram during data retention for the structure of the first embodiment;

FIGS. 12A and 12B are cross-sectional views showing the process of manufacturing a MONOS nonvolatile semiconductor memory device according to a second embodiment;

FIGS. 13A and 13B are cross-sectional views showing the process of manufacturing a MONOS nonvolatile semiconductor memory device according to a second embodiment;

FIGS. 14A and 14B are cross-sectional views showing the process of manufacturing a MONOS nonvolatile semiconductor memory device according to a third embodiment;

FIGS. 15A and 15B are cross-sectional views showing the process of manufacturing a MONOS nonvolatile semiconductor memory device according to a third embodiment;

FIGS. 16A and 16B are cross-sectional views showing the process of manufacturing a MONOS nonvolatile semiconductor memory device according to a third embodiment;

FIGS. 17A and 17B are cross-sectional views showing the process of manufacturing a MONOS nonvolatile semiconductor memory device according to a third embodiment;

FIGS. 18A and 18B are cross-sectional views showing the process of manufacturing a MONOS nonvolatile semiconductor memory device according to a third embodiment;

FIGS. 19A and 19B are cross-sectional views showing the process of manufacturing a MONOS nonvolatile semiconductor memory device according to a third embodiment; and FIGS. 20A and 20B are cross-sectional views showing the process of manufacturing a MONOS nonvolatile semiconductor memory device according to a third embodiment.

DETAILED DESCRIPTION OF THE INVENTION

Various embodiments of the present invention will be hereinafter described with reference to the accompanying drawings.

First Embodiment

Figure 1:
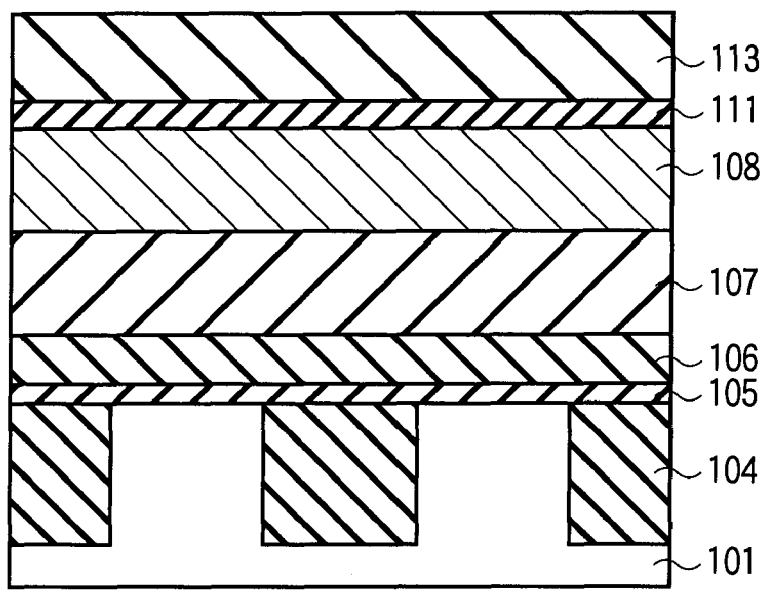
FIG. 1 is a cross-sectional view in the word line direction to explain the structure of a memory cell of a MONOS nonvolatile semiconductor memory device according to a first embodiment.
Figure 2:
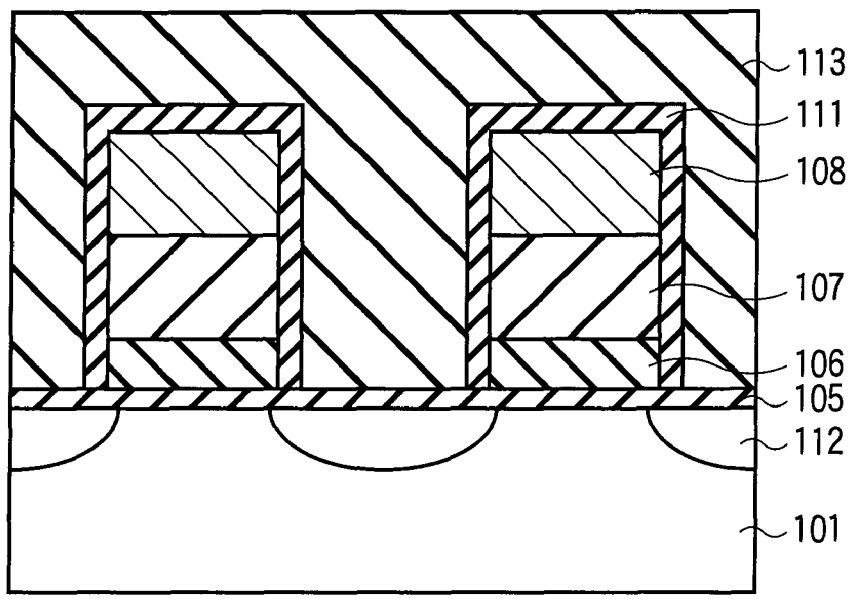
FIG. 2 is a cross-sectional view in the bit line direction to explain the structure of a memory cell of a MONOS nonvolatile semiconductor memory device according to a first embodiment.

FIGS. 1 and 2 are pattern diagrams to explain the structure of a memory cell of a MONOS nonvolatile semiconductor memory device according to a first embodiment, and FIG. 1 is a cross-sectional view in the word line direction (channel width direction) and FIG. 2 is a cross-sectional view in the bit line direction (channel length direction). In addition, in FIGS. 1 and 2, two memory cells are shown, but actually, many memory cells are arrayed.

An element forming region (AA), which is surrounded by STI 104 is formed on the silicon substrate. A tunnel insulating film 105, a charge storage layer 106, a block insulating film 107 and a control gate electrode 108 are sequentially stacked on the silicon substrate 101, and they are processed to a gate pattern. A sidewall insulating film 111 is formed to cover the gate structure. And, an insulating film 113 to fill in the gap is formed on the entire surface, and the surface of the formed insulating film 113 is planarized. Moreover, both sides of the gate structure on the surface of the silicon substrate 101 are formed with source/drain diffusion layers 112.

Next, the method of manufacturing a nonvolatile semiconductor memory device according to this embodiment will be described below with reference to FIGS. 3A and 3B to 9A and 9B. In FIGS. 3A and 3B to FIGS. 9A and 9B, FIGS. 3A to 9A are cross-sectional view in the word line (channel width) direction, and FIGS. 3B to 9B are cross-sectional view in the bit line (channel length) direction.

As shown in FIGS. 3A and 3B, a mask film 102 for isolation processing, that is, a silicon nitride film is deposited on the surface of the silicon substrate by chemical vapor deposition (CVD) method. Then, the mask film 102 and the silicon substrate 101 are etched by reactive ion etching (RIE) using a first resist mask (not shown) to form an isolation trench 103 having a depth of 100 nm.

And then, as shown in FIGS. 4A and 4B, a silicon oxide film (isolation insulating film) 104 for isolation is deposited on the entire surface so that the isolation trench 103 is completely filled with the silicon oxide film 104. Thereafter, the surface of the silicon oxide film 104 is removed by chemical mechanical polishing (CMP) to planarize the surface thereof. In this way, the mask film 102 is exposed.

And then, as shown in FIGS. 5A and 5B, the exposed mask film 102 is selectively etched by a chemical solution, and the mask film 102 is removed. Thereafter, the exposed surface of the silicon oxide film 104 is etched by the same height as the silicon substrate 101 using a diluted hydrofluoric acid solution.

And then, as shown in FIGS. 6A and 6B, a silicon oxide film (tunnel insulating film) 105 of thickness 5 nm is formed by thermal oxidation. Further, a charge storage layer, that is, a silicon nitride film of thickness 5 nm is deposited on the silicon oxide film 105 by CVD method. Thereafter, a high-dielectric constant insulating film (high-k film), that is, an alumina film is deposited as a block insulating film 107 by 30 nm by atomic layer deposition (ALD) using tri-methyl aluminum and water vapor as a source gas.

In this case, after the alumina film as the block insulating film 107 is deposited, the first heat treatment is carried out in a nitrogen atmosphere at the temperature of 1000° C. for one minute to densify the alumina film. And, after that, as shown in FIGS. 7A and 7B, the second heat treatment is carried out in the atmosphere containing water vapor of 50 kPa at the temperature of 800° C. for 30 minutes to compensate for oxygen vacancies in the alumina film.

And then, as shown in FIGS. 8A and 8B, a control gate electrode 108, that is, a two-layer structure conductive layer comprising polysilicon layer/tungsten silicide layer and having a thickness of 100 nm is deposited by CVD method.

And then, as shown in FIGS. 9A and 9B, a mask film (silicon nitride film) is deposited by CVD method. Further, the mask film 109, the control gate electrode 108, the block insulating film 107 and the charge storage layer 106 are sequentially etched by RIE using a second resist pattern (not shown) having a pattern orthogonal to the first resist mask, and a gate structure is formed.

In addition, a gate side wall oxide film 111 of thickness 10 nm is formed by combining thermal oxidation and CVD method at the sidewall of the gate structure comprising the control gate electrode 108, the block insulating film 107 and the charge storage layer 106. Thereafter, a source/drain region, that is, an impurity diffusion layer 112 is formed on the surface layer of the semiconductor substrate 101 by ion implantation and thermal annealing. Further, an interlayer insulating film 113 is formed on the upper surface of the silicon oxide film 105 and the gate sidewall oxide film 111 by CVD method. Interconnect layers (not shown) and so on are formed by a known technique, and thereby, a memory cell having the structure shown in FIG. 1 is formed.

According to the method of this embodiment, the alumina film as the block insulating film 107 is deposited, and thereafter, the heat treatment is carried out in the nitrogen atmosphere at first. The alumina film is densified by the heat treatment. Therefore, the alumina film gets sufficient etching resistance against the wet treatment when the gate pattern is processed, and in addition, the dielectric characteristic is also improved because of the impurity contained in the alumina film is reduced. In addition, in order to ensure the sufficient wet etching resistance, the desirable temperature of the heat treatment is 800° C. or more, and further preferably, 1000° C. or more.

However, in the case of the MONOS nonvolatile memory having showed by the above method, even if the block insulating film 107, that is, the alumina film is densified at high temperature of 800° C. or more, a sufficient dielectric characteristic is not attained. This is because of the silicon nitride film as the charge storage layer 106 deprives oxygen of alumina film during the high-temperature heat treatment in the nitrogen atmosphere, and oxygen vacancies are formed in the alumina film. The alumina film which has oxygen vacancies is in a positively charged state, so the energy band diagram during data retention is as shown in FIG. 10. As shown in FIG. 10, the effective tunnel distance L for the trapped electron in the charge storage layer 106 is shortened, and therefore, electrons trapped in the charge storage layer 106 easily leak to the alumina film 107.

According to this embodiment, the alumina film is densified by the heat treatment in the nitrogen atmosphere, and thereafter, the second heat treatment is carried out in the atmosphere containing water vapor. The oxygen vacancies in the alumina film are compensated by the second heat treatment in the atmosphere containing water vapor. Oxygen vacancies in the alumina film are compensated, and thereby, an energy band diagram during data retention is as shown in FIG. 11; namely, the effective tunnel distance L of the trapped electron in the charge storage layer 106 is increased contrary to FIG. 10. As a result, charge leakage through the alumina film is prevented during data retention and in a write/erase operation; therefore, a preferable memory cell characteristic is obtained.

In addition, water vapor has a high ability of diffusing into dielectric films such as alumina and a hafnium oxide. Further, water vapor supply easily oxygen to the oxygen vacancies position since it is diffused replacing oxygen atoms in an oxide film. Therefore this embodiment is the most suitable if it is supplied oxidizing agent to a relatively tick block insulating film and then decreased oxide vacancies. Moreover, if the second heat treatment is carried out using oxygen radicals, ozone and other oxidizing gases such as oxygen gas, the same effect is obtained although the effect is lower than the atmosphere containing water vapor.

In the case of the heat treatment in the atmosphere containing water vapor showed above method, the data retention of memory cell can be obtained a preferable characteristic by the higher heat treatment temperature. Preferably, the heat treatment temperature is 400° C. or more to sufficiently decrease oxygen vacancies in the alumina film. On the other hand, in the write characteristic, the write efficiency is improved with the high-temperature of the heat treatment temperature, and the threshold voltage window (i.e., difference between threshold in a write state and threshold in an erase state) tends to increase. However, when the heat treatment temperature is 800° C. or more, the write efficiency is decreased. This is supposed that the silicon nitride film 106 as the charge storage layer is oxidized and the trap density is decreased, and an oxidizing gas penetrates through the alumina and silicon nitride film, the tunnel insulating film 105 gets thicker. Considering the foregoing matters, preferably, the heat treatment temperature in the atmosphere containing water vapor is set in the range of 400 to 800° C.

According to this embodiment, after the block insulating film 107 consisting of alumina is formed, the heat treatment is carried out in the nitrogen atmosphere to densify alumina. Further, the heat treatment is carried out in the atmosphere containing oxidizing gas. By these processing, oxygen vacancies in the block insulating film 107 are compensated. Therefore, it is possible to prevent carriers of the charge storage layer 106 from leaking to the block insulating film 107.

According to this embodiment, the alumina film is given as a high-dielectric constant insulating film used for the block insulating film 107. However, it is not only the alumina film, but also an insulating film containing other oxides of metals oxides such as hafnium, zirconium, lanthanum, yttrium and tantrum may be used. In addition, an insulating film containing two metal oxides such as hafnium-aluminate may be used, or an dielectric film containing a silicon oxide such as hafnium-silicate may be used. In particular, an insulating film containing a transition metal oxide such as hafnium and zirconium has properties that oxygen vacancies are easily formed in the film. For this reason, the heat treatment in the atmosphere containing water vapor is carried out, and thereby, the effect is increased.

In addition, this embodiment relates to the structure in which the silicon nitride film as the charge storage layer 106 and a metal oxide having high dielectric constant is stacked as the block insulating film 107 on the charge storage layer 106. However, the present invention is not necessarily limited to this structure. For example, an insulating film layer mainly containing a silicon oxide may be formed between the silicon nitride film as the charge storage layer 106 and the metal oxide as the block insulating film 107. In particular, When a thickness of the insulating film layer mainly containing silicon oxide is 2 nm or less, oxygen in the metal oxide film is easily taken by a lower-layer silicon film during heat treatment in N2 and oxygen vacancies are formed. For the reason, the heat treatment in the atmosphere containing water vapor has a profound effect.

Even if a high-dielectric constant insulating film is stacked on the silicon nitride film functioning as the charge storage layer, trapped carriers are prevented from being moved toward the block insulating film by the heat treatment in the atmosphere containing an oxidizing gas. As a result, this serves to improve the data retention and write/erase characteristics of a memory cell. In other words, in a MONOS nonvolatile memory, which has a silicon nitride film and a metal oxide film between the tunnel insulating film 105 and the control gate electrode 108, the effect of this embodiment is obtained.

According to this embodiment, a metal oxide film having high dielectric constant is densified, and thereafter, the heat treatment is carried out in the atmosphere containing water vapor. However, there is no need of always carrying out the heat treatment in a state that the metal oxide film is exposed. For example, if the block insulating film 107 is formed by laminate structure of Al2O3 and SiO2, a silicon oxide film functioning as an upper-layer block insulating film is further deposited on the metal oxide film, and thereafter, the heat treatment may be carried out in the atmosphere containing water vapor. In other words, so long as the heat treatment is carried out in the atmosphere containing an oxidizing agent until the control gate electrode 108 is formed after the block insulating film 107 is formed or from the way of forming the film 107, the effect of this embodiment is achieved.

Second Embodiment

FIGS. 12A and 12B and FIGS. 13A and 13B are pattern diagrams to explain the process of manufacturing a nonvolatile semiconductor memory device according to a second embodiment, and FIGS. 12A and 13A are cross-sectional views in the word line direction (channel width direction) and FIGS. 12B and 13B are cross-sectional views in the bit line direction (channel length direction). The same numerals are used to designate portions identical to FIG. 1 to FIGS. 9A and 9B, and the detailed explanation is omitted.

The characteristic of the second embodiment which differences from the first embodiment is carried out in an oxidizing atmosphere after a gate structure is formed.

As with the process of the first embodiment shown in FIGS. 3A and 3B to FIGS. 9A and 9B. An isolation insulating film 104 is filled in the surface of a silicon substrate 101 and a tunnel insulating film 105, a charge storage layer 106, a block insulating film 107, a control gate electrode 108 and a mask film 109 are formed on the substrate 101 and the isolation insulating film 104. Here, like the first embodiment, the first heat treatment is carried out in the nitrogen atmosphere at the temperature of 1000° C. for one minute after an alumina film as the block insulating 107 is deposited. Further, the second heat treatment is carried out in the atmosphere containing 50 kPa at the temperature of 800° C. for 30 minutes, and thereby, the same effect as the first embodiment is obtained.

Next, like the first embodiment, the mask film 109, control gate electrode 108, block insulating film 107 and charge storage layer 106 are successively etched by RIE using a second resist mask (not shown) having a pattern orthogonal to a first resist mask. In this way, a gate structure is formed. The sectional structure of this state is the same as shown in FIGS. 9A and 9B.

As shown in FIGS. 12A and 12B, oxygen radicals are generated by microwaves in an oxygen atmosphere diluted by a rare gas and the radical oxidization treatment (a second heat treatment) is carried out at the temperature of 400° C. for 30 seconds. Thereafter, as shown in FIGS. 13A and 13B, a gate sidewall oxide film 111 of thickness 10 nm is formed by CVD method at the sidewall of the gate structure comprising the control gate electrode 108, block insulating film 107 and charge storage layer 106. After this, a nonvolatile memory cell is formed according to the same method as the first embodiment.

According to the method of this embodiment, the second heat treatment is carried out in the atmosphere containing oxygen radicals after the control gate electrode 108 is processed to a gate pattern. While the control gate electrode 108 is processing, the sidewall of the alumina film is reduced by an etching gas of RIE, and the oxygen vacancies are formed. For this reason, the edge of a tunnel operating region acts as leakage pass, and the memory cell characteristic is degraded. However, according to this embodiment, oxygen vacancies are compensated by the second heat treatment being carried out in the oxygen radical atmosphere. As a result, a preferable memory cell characteristic is obtained. In addition, oxygen vacancies in the bulk of the alumina film also are decreased by the heat treatment being carried out in the oxygen radical atmosphere.

According to the oxygen radical used for the heat treatment to compensate for oxygen vacancies, an oxidizability is very strong, but then a diffusion distance to the insulating film is short. Therefore, according to this embodiment if the oxidization is carried out from the sidewall, it is possible that the restore of oxygen vacancies with suppressing the oxidization of silicon nitride as the charge storage layer 106 and without forming of bird's beak into the tunnel insulating film 105. Therefore, the oxygen radical is the most suitable for the heat treatment in this case. However, even if the heat treatment is carried out using water vapor, ozone and another oxidizing gas such as oxygen, the effect of this embodiment can be obtained.

According to the heat treatment in the oxygen radical atmosphere described in the above method, the data retention of memory cell can be obtained a preferable characteristic by the higher heat treatment temperature. Therefore, a preferable data retention characteristic of a memory cell is obtained. The write characteristic of the memory cell almost does not depend on the temperature when the heat treatment temperature is 550° C. or less, but then it is degraded when the heat treatment temperature is 550° C. or more. This is supposed that bird's beak to the tunnel oxide film 105 is produced, because an oxidizability is too strong, and the trap density is decreased, because the silicon nitride film are oxidized. Therefore, preferably, the heat treatment temperature in the oxygen radical atmosphere is set in the range of 100 to 550° C.

In addition, According to this embodiment, the alumina film as a high-dielectric constant insulating film used for the block insulating film 107 is mentioned to an example. However, it is not only the alumina film, but also various metal oxides may be used as described in the first embodiment.

According to this embodiment, oxygen radicals are generated by microwaves in the oxygen atmosphere diluted by a rare gas. Another method may be employed as the method of generating the oxygen radicals. For example, a wafer is heated in a mixed gas atmosphere of hydrogen and oxygen, and then, the oxygen radicals are generated with a water generation reaction.

According to this embodiment, the heat treatment is carried out in the atmosphere containing an oxidizing agent after the control gate electrode 108 is formed. In addition, the heat treatment may be carried out in the atmosphere containing an oxidizing agent after the gate sidewall oxide film 111 is formed. In particular, if a source gas containing hydrogen and chlorine is used for depositing the gate sidewall oxide film 111, oxygen vacancies are produced in the sidewall of the metal oxide film by reduction. For this reason, it is particularly effective that the heat treatment is carried out in the atmosphere containing an oxidizing agent after the gate sidewall oxide film 111 is formed. Therefore, if the sufficient effect is obtained by the heat treatment after the gate sidewall oxide film 111 is formed, the heat treatment may be omitted after the control gate electrode 108.

This embodiment provides the structure in which a metal oxide film having high dielectric constant is stacked as the block insulating film 107 on the silicon nitride film as the charge storage layer 106. However, as described in the first embodiment, a dielectric film layer mainly containing of a silicon oxide film may be formed between the silicon nitride film and the metal oxide film. Further, even if a high dielectric constant insulating film is stacked on the silicon nitride film as the charge storage layer 106, the heat treatment is carried out in the atmosphere containing an oxidizing agent. Therefore, carriers of the charge storage layer 106 are prevented from being moved to the block insulating film 107 through the edge of a tunnel operation region. As a result, it is possible to improve the data retention and write/erase characteristics of a memory cell.

Third Embodiment

FIGS. 14A and 14B to FIGS. 20A ad 20B are pattern diagrams to explain the process of manufacturing a nonvolatile semiconductor memory device according to a third embodiment, and FIGS. 14A to 20A are the cross-sectional views in the word line direction (channel width direction). FIGS. 14B to 20B are the cross-sectional views in the bit line direction (channel length direction).

As shown in FIGS. 14A and 14B, a silicon oxide film (tunnel insulating film) of thickness 5 nm is formed by the thermal oxidization on the surface of a silicon substrate (semiconductor substrate) 301 doped with a desired impurity and then a silicon nitride film layer as a charge storage layer 306 of thickness 5 nm is deposited by CVD method, and further an alumina film as a block insulating film 307 of thickness 30 nm is sequentially deposited by ALD method. In this case, after the alumina film is deposited, the heat treatment is carried out in the nitrogen atmosphere at the temperature 1000° C. for one minute to densify the alumina film.

And then, as shown in FIGS. 15A and 15B, a silicon nitride film as a mask film 309 for the isolation processing is deposited by CVD method. Thereafter, the mask film 309, block insulating film 307, charge storage layer 306 and tunnel oxide film 305 are sequentially etched by RIE using a first resist mask (not shown). Further, the exposed area of the silicon substrate 301 is etched to form an isolation trench 303 having a depth of 100 nm.

And then, as shown in FIGS. 16A and 16B, in order to compensate for oxygen vacancies in alumina as the block insulating film 307, oxygen radicals are generated by microwaves in the oxygen atmosphere diluted by a rare gas, and radical oxidization (a heat treatment) is carried out at the temperature of 400° C. for 30 seconds.

And then, as shown in FIGS. 17A and 17B, a silicon oxide film 304 for isolation is deposited on the entire surface so that the isolation trench is filled with the silicon oxide film 304. Thereafter, the surface of the silicon oxide film 304 is removed by CMP so that the surface is planarized. In this case, the mask film 309 is exposed.

And then, as shown in FIGS. 18A and 18B, the exposed mask film 309 is selectively etched using a chemical solution. The exposed surface of the silicon oxide film 304 is etched by the same height as the surface of the block insulating film 307 using a diluted hydrofluoric acid solution.

And then, as shown in FIGS. 19A and 19B, a control gate electrode 308 as a two-layer structure conductive layer comprising polysilicon layer/tungsten silicide layer of thickness 100 nm is deposited by CVD method.

And then, as shown in FIGS. 20A and 20B, the control gate electrode 308, block insulating film 307 and charge storage layer 306 are etched to a gate pattern as with the first embodiment. And then a gate sidewall oxide film 311 is formed Furthermore, an interlayer insulating film 313 is formed. Then, interconnect layers (not shown) are formed by a known technique, and thereby, a memory cell structure is formed.

According to this embodiment, isolation is carried out by RIE after the alumina film as the block insulating film 307 is deposited. Therefore the charge storage layer 306 is isolated. As a result, the charge migration is prevented between cells, and the data retention characteristic of a memory cell is improved. By the isolation trench etching is carried out, oxygen vacancies are produced in the sidewall of the alumina film. As a result, the memory cell characteristic is degraded as described in the second embodiment.

According to this embodiment, the heat treatment is carried out in the atmosphere containing oxygen radicals after the isolation trench is etched. As described above, the heat treatment is carried out in the atmosphere containing oxygen radicals, and thereby, oxygen vacancies are compensated and a preferable memory cell characteristic is obtained. In addition, oxygen vacancies in the bulk of the alumina film also are decreased.

According to the above method, the alumina film is given as a high dielectric constant insulating film used for the block insulating film 307. However, the present invention is not limited to the alumina film. For example, various metal oxide films may be used as described in the first embodiment.

According to the oxygen radical used for the heat treatment to compensate for oxygen vacancies, an oxidizability is very strong, but then a diffusion distance into the dielectric film is short as described in the second embodiment. Therefore, this embodiment is the most suitable to the case where oxidization is carried out from the sidewall. However, even if the heat treatment is carried out using water vapor, ozone and another oxidizing gas such as oxygen, the effect of this embodiment is obtained.

Preferably, the heat treatment temperature in the oxygen radical atmosphere is set in the range of 100 to 550° C., as in the second embodiment. According to this embodiment, oxygen radicals are generated using microwaves in the oxygen atmosphere diluted by a rare gas. In this case, another method may be employed as the method of generating the oxygen radicals. For example, a wafer is heated in a mixed gas atmosphere of hydrogen and oxygen, and then, oxygen radicals may be generated with a formation reaction of water.

According to this embodiment, the heat treatment is carried out in the atmosphere containing an oxidizing agent after the isolation trench is formed. In addition to the process, the heat treatment may be carried out in the atmosphere containing an oxidizing agent after the isolation silicon oxide film 304 is deposited. In particular, if a source gas containing hydrogen and chlorine is used to deposit the isolation silicon oxide film 304, oxygen vacancies are produced in the sidewall of an $Al_2O_3$ film by reduction. For this reason, the effect of this embodiment is greatly affected. If a sufficient effect is obtained by the heat treatment after the isolation silicon oxide film 304 is formed, the heat treatment after the isolation silicon oxide film 304 may be omitted.

Moreover, a sidewall oxide film is formed to protect the sidewall surface of the isolation trench 303 before the isolation silicon oxide film 304 is formed. In this case, the heat treatment may be carried out in the atmosphere containing an oxidizing agent after the sidewall oxide film is formed in addition to the heat treatment after the isolation trench is formed. As with the second embodiment, if a source gas containing hydrogen and chlorine is used to deposit the sidewall oxide film, oxygen vacancies are produced in the sidewall of a metal oxide film by reduction. For this reason, the effect by the heat treatment in the atmosphere containing an oxidizing agent is great. If a sufficient effect is obtained by the heat treatment after the sidewall oxide film is formed, the heat treatment after the isolation trench may be omitted.

According to this embodiment, the laminated structure that a metal oxide film having high dielectric constant as the block insulating film 307 is stacked on the silicon nitride film as the charge storage layer 306 is shown. As described in the first embodiment, a dielectric film mainly containing a silicon oxide film may be formed between the silicon nitride film and the metal oxide film. Further, as described in the second embodiment, even if the laminated structure that a high dielectric constant insulating film as a charge storage layer id stacked on the silicon nitride film, the same effect is obtained by carrying out the heat treatment in the atmosphere containing an oxidizing agent. In this case, the high dielectric constant insulating film may use a hafnium oxide film or a zirconium oxide film. These dielectric films have a trap density higher than the silicon nitride film. Therefore it is possible to further improve the write/erase characteristic.

Modification Example

The present invention is not limited to the foregoing embodiments.

According to the first embodiment, the heat treatment is carried out in the nitrogen atmosphere before the heat treatment is carried out in the atmosphere containing an oxidizing gas after the block insulating film is formed. This is because of improving the density of a metal oxide film used as the block insulating film, and an inert gas except nitrogen may be used. If the block insulating film is sufficiently densified, the heat treatment in the inert gas may be omitted.

According to the second embodiment, the first heat treatment, which the heat treatment in the atmosphere containing an oxidizing gas is carried out before the control gate electrode is formed after the block insulating film is formed and the second heat treatment, which the heat treatment in the atmosphere containing an oxidizing gas is carried out after a gate pattern is formed may be carried out. If oxygen vacancies are sufficiently compensated by the second heat treatment, the first heat treatment may be omitted.

According to the third embodiment, the heat treatment is carried out after the isolation trench is formed. The heat treatment may be carried out after the block insulating film is formed as with the first embodiment. Namely, the first heat treatment, which the heat treatment in the atmosphere containing an oxidizing gas is carried out after the block insulating film is formed and the second heat treatment, which the heat treatment in the atmosphere containing an oxidizing gas is carried out after the isolation trench is formed may be carried out. In addition, as with the second embodiment, the third heat treatment, which the heat treatment in the atmosphere containing an oxidizing gas is carried out after the gate pattern is formed may be carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile semiconductor memory device comprising:
   forming a tunnel insulating film on a semiconductor substrate;
   forming a charge storage layer on the tunnel insulating film;
   forming a block insulating film containing a metal oxide on the charge storage layer;
   carrying out a first heat treatment in an atmosphere containing an oxidizing gas after the block insulating film is formed;
   forming a control gate electrode on the block insulating film after the first heat treatment is carried out; and
   processing the block insulating film and the charge storage layer to a gate pattern,
   the method further comprising carrying out a heat treatment in an atmosphere containing an inert gas before the first heat treatment is carried out after the block insulating film is formed,
   wherein an oxidizability of the first heat treatment in the atmosphere containing the oxidizing gas is stronger than an oxidizability of the heat treatment in the atmosphere containing the inert gas.

2. The method according to claim 1, wherein a nitrogen gas is used as the inert gas.

3. A method of manufacturing a nonvolatile semiconductor memory device comprising:
   forming a tunnel insulating film on a semiconductor substrate;
   forming a charge storage layer on the tunnel insulating film;
   forming a block insulating film containing a metal oxide on the charge storage layer;
   carrying out a first heat treatment in an atmosphere containing an oxidizing gas after the block insulating film is formed;
   forming a control gate electrode on the block insulating film after the first heat treatment is carried out; and
   processing the block insulating film and the charge storage layer to a gate pattern,
   wherein a heat treatment in an atmosphere containing water vapor is carried out as the first heat treatment.

4. A method of manufacturing a nonvolatile semiconductor memory device comprising:
   forming a tunnel insulating film on a semiconductor substrate;
   forming a charge storage layer on the tunnel insulating film;
   forming a block insulating film containing a metal oxide on the charge storage layer;
   carrying out a first heat treatment in an atmosphere containing an oxidizing gas after the block insulating film is formed;
   forming a control gate electrode on the block insulating film after the first heat treatment is carried out; and
   processing the block insulating film and the charge storage layer to a gate pattern,
   the method further comprising carrying out a heat treatment in an atmosphere containing an inert gas before the first heat treatment is carried out after the block insulating film is formed,
   wherein the first heat treatment temperature is set in a range of 400 to 800° C.

5. A method of manufacturing a nonvolatile semiconductor memory device comprising:
   forming a tunnel insulating film on a semiconductor substrate;
   forming a charge storage layer on the tunnel insulating film;
   forming a block insulating film containing a metal oxide on the charge storage layer;
   carrying out a first heat treatment in an atmosphere containing an oxidizing gas after the block insulating film is formed;
   forming a control gate electrode on the block insulating film after the first heat treatment is carried out;
   processing the block insulating film and the charge storage layer to a gate pattern; and
   carrying out a second heat treatment in an atmosphere containing an oxidizing gas after the gate pattern is formed.

6. A method of manufacturing a nonvolatile semiconductor memory device comprising:
   forming a tunnel insulating film on a semiconductor substrate;

forming a charge storage layer on the tunnel insulating film;

forming a block insulating film containing a metal oxide on the charge storage layer;

carrying out a first heat treatment in an atmosphere containing an oxidizing gas after the block insulating film is formed;

forming a control gate electrode on the block insulating film after the first heat treatment is carried out;

processing the block insulating film and the charge storage layer to a gate pattern; and forming a sidewall oxide film at a side of a gate structure after the gate pattern is formed, and carrying out the second heat treatment in an atmosphere containing an oxidizing gas after the sidewall oxide film is formed.

7. The method according to claim 5, further comprising:

forming a sidewall oxide film at a side of a gate structure after the second heat treatment is carried out, and carrying out a third heat treatment in an atmosphere containing an oxidizing gas after the sidewall oxide film is formed.

8. The method according to claim 1, further comprising:

forming an isolation trench extending from the block insulating film to the semiconductor substrate to insulate the charge storage layer in a channel width direction before the control gate electrode is formed after the block insulating film is formed, and carrying out a second heat treatment in an atmosphere containing an oxidizing gas after the isolation trench is formed, and further, filling an isolation insulating film in the isolation trench after the second heat treatment is carried out.

9. The method according to claim 1, further comprising:

forming an isolation trench extending from the block insulating film to the semiconductor substrate to isolate the charge storage layer in a channel width direction before the control gate electrode is formed after the block insulating film is formed, and carrying out a second heat treatment in an atmosphere containing an oxidizing gas after the isolation trench is formed, and further, filling an isolation insulating film in the isolation trench after the second heat treatment is carried out;

forming the control gate electrode on the block insulating film and the isolation insulating film; and carrying out a third heat treatment in an atmosphere containing an oxidizing gas after the gate pattern is formed.

10. A method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

forming a control gate electrode on the block insulating film;

processing the block insulating film and the charge storage layer to a gate pattern; and carrying out a first heat treatment in an atmosphere containing an oxidizing gas after the gate pattern is formed, wherein heat treatment is carried out in an atmosphere containing an oxygen radical as the first heat treatment.

11. A method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

forming a control gate electrode on the block insulating film;

processing the block insulating film and the charge storage layer to a gate pattern;

carrying out a first heat treatment in an atmosphere containing an oxidizing gas after the gate pattern is formed; and forming a sidewall oxide film at the side of a gate structure after the gate pattern is formed, and carrying out the first heat treatment in an atmosphere containing an oxidizing gas after the sidewall oxide film is formed.

12. A method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

forming a control gate electrode on the block insulating film;

processing the block insulating film and the charge storage layer to a gate pattern;

carrying out a first heat treatment in an atmosphere containing an oxidizing gas after the gate pattern is formed; and forming a sidewall oxide film at the side of a gate structure after the first heat treatment is carried out, and carrying out a second heat treatment in an atmosphere containing an oxidizing gas after the sidewall oxide film is formed.

13. A method of manufacturing a nonvolatile semiconductor memory device comprising:

forming a tunnel insulating film on a semiconductor substrate;

forming a charge storage layer on the tunnel insulating film;

forming a block insulating film containing a metal oxide on the charge storage layer;

forming an isolation trench extending from the block insulating film to the semiconductor substrate to isolate the charge storage layer in a channel width direction;

carrying out a first heat treatment in an atmosphere containing an oxidizing gas after the isolation trench is formed; and filling an isolation insulating film in the isolation trench after the first heat treatment is carried out.

14. The method according to claim 13, wherein heat treatment is carried out in an atmosphere containing an oxygen radical as the first heat treatment.

15. The method according to claim 13, further comprising:

forming a sidewall oxide film at the sidewall of the isolation trench after the first heat treatment is carried out, and carrying out the first heat treatment after the sidewall oxide film is formed.

16. The method according to claim 13, further comprising:

forming a sidewall oxide film at the sidewall of the isolation trench after the first heat treatment is carried out, and carrying out a second heat treatment in an atmosphere containing an oxidizing gas after the sidewall oxide film is formed.

* * * * *